(12) United States Patent
Wang (10) Patent No.: US 11,314,267 B2
(45) Date of Patent: Apr. 26, 2022

(54) ADJUSTER AND CHIP

(71) Applicant: SHENZHEN GOODIX TECHNOLOGY CO., LTD., Shenzhen (CN)

(72) Inventor: Chengzuo Wang, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/126,684

(22) Filed: Dec. 18, 2020

(65) Prior Publication Data
US 2021/0200252 A1 Jul. 1, 2021

Related U.S. Application Data

(63) Continuation of application No. PCT/CN2019/128836, filed on Dec. 26, 2019.

(51) Int. Cl.
*G05F 1/56* (2006.01)
*G05F 1/565* (2006.01)
*H03K 17/16* (2006.01)

(52) U.S. Cl.
CPC ........... *G05F 1/565* (2013.01); *H03K 17/167* (2013.01)

(58) Field of Classification Search
CPC ........... G05F 1/462; G05F 1/565; G05F 1/575
See application file for complete search history.

(56) References Cited

U.S. PATENT DOCUMENTS

| | | | | |
|---|---|---|---|---|
| 6,225,857 B1* | 5/2001 | Brokaw | ........... | G05F 1/575 |
| | | | | 327/540 |
| 6,445,167 B1* | 9/2002 | Marty | ........... | G05F 1/468 |
| | | | | 323/274 |
| 8,018,214 B2 | 9/2011 | Kwon et al. | | |
| 9,946,283 B1* | 4/2018 | Yung | ........... | G05F 1/575 |
| 2005/0253569 A1 | 11/2005 | Sugiura | | |
| 2009/0009147 A1* | 1/2009 | Jian | ........... | G05F 1/575 |
| | | | | 323/280 |
| 2009/0295340 A1 | 12/2009 | Kwon et al. | | |

(Continued)

FOREIGN PATENT DOCUMENTS

| | | |
|---|---|---|
| CN | 1591115 A | 3/2005 |
| CN | 101354595 A | 1/2009 |
| CN | 101896874 A | 11/2010 |

(Continued)

*Primary Examiner* — Kyle J Moody
*Assistant Examiner* — Lakaisha Jackson (57) ABSTRACT

An adjuster includes a power transfer circuit, a negative feedback circuit, a constant current source circuit and a control circuit. Two inputs of an error amplifier in the negative feedback circuit receive a reference voltage and a feedback voltage corresponding to an output signal of the adjuster respectively, and the error amplifier is configured to output a first voltage signal when the feedback voltage is less than the reference voltage, and output a second voltage signal when the feedback voltage is greater than the reference voltage, during the starting process of the adjuster. The control circuit is configured to control the negative feedback circuit to be turned off and the constant current source circuit to be turned on, and control the constant current source circuit to be turned off and the negative circuit to be turned on according to the second voltage signal.

20 Claims, 4 Drawing Sheets

(56) References Cited

U.S. PATENT DOCUMENTS

2016/0349776 A1    12/2016  Conte
2021/0127380 A1*   4/2021  Liu ...................... H04W 40/22

FOREIGN PATENT DOCUMENTS

| CN | 102545572 | A | 7/2012 |
| --- | --- | --- | --- |
| CN | 103427617 | A | 12/2013 |
| CN | 109416742 | A | 3/2019 |
| EP | 0691729 | A2 | 1/1996 |

* cited by examiner

ADJUSTER AND CHIP

CROSS-REFERENCE TO RELATED APPLICATIONS

This application is a continuation of International Application No. PCT/CN2019/128836, filed on Dec. 26, 2019, the disclosure of which is hereby incorporated by reference in its entirety.

TECHNICAL FIELD

The present application relates to the field of electronic technology, in particular, to an adjuster and a chip.

BACKGROUND

An adjuster amplifies the difference between a feedback quantity and a reference quantity through an operational amplifier so that an output quantity is controlled not to change with changes in input voltage, load, etc., that is, to adjust for a stable output through a negative feedback loop. When the adjuster establishes an output, because the difference between the feedback quantity and the reference value is too large, an excessive input current will be generated. And the excessive input current will increase overload pressure of a previous stage power supply such as a previous stage adjuster, cause the previous stage power supply to power down, damage external components of the adjuster, or burn a chip of the adjuster. Therefore, how to prevent the adjuster from generating the excessive input current during the process of establishing the output has become an urgent problem to be solved.

SUMMARY

An adjuster and a chip are provided in the present application, which can avoid the adjuster to generate an excessive input current during the process of establishing an output thereof.

In a first aspect, an adjuster is provided, including a power transfer circuit, a negative feedback circuit, a constant current source circuit and a control circuit.

The negative feedback circuit includes an error amplifier. An input of the error amplifier receives a reference voltage, and another input of the error amplifier receives a feedback voltage corresponding to an output signal of the adjuster. The error amplifier is configured to, during the starting process of the adjuster, output a first voltage signal when the feedback voltage is less than the reference voltage and output a second voltage signal when the feedback voltage is greater than the reference voltage.

The control circuit is connected to an output of the error amplifier, and is configured to:

control the negative feedback circuit to be turned off and the constant current source circuit to be turned on according to the first voltage signal. When the constant current source circuit is turned on, the constant current source circuit is connected to the power transfer circuit, and is configured to control an input current to be constant during the starting process of the adjuster; and control the constant current source circuit to be turned off and the negative feedback circuit to be turned on according to the second voltage signal. When the negative feedback circuit is turned on, the negative feedback circuit forms a negative feedback loop with the power transfer circuit, and is configured to provide a negative feedback adjustment signal corresponding to the output signal of the adjuster to the power transfer circuit, and the power transfer circuit is configured to perform negative feedback adjustment to the output signal according to the negative feedback adjustment signal, thereby making the output signal is maintained at a preset level.

In a possible implementation manner, the control circuit includes a trigger. The trigger is configured to receive a voltage signal output by the error amplifier and generate a first control signal and a second control signal. The first control signal is configured to control the negative feedback circuit to be turned off and on, and the second control signal is configured to control the constant current source circuit to be turned off and on.

In a possible implementation manner, the control circuit further includes 2N inverters connected between the error amplifier and the trigger, where N is a positive integer.

In a possible implementation manner, the power transfer circuit includes a power tube. A gate electrode of the power tube is connected to the output of the error amplifier, and a source electrode and a drain electrode of the power tube are connected to the input of the adjuster and the output of the adjuster respectively.

In a possible implementation manner, the constant current source circuit includes a first transistor and a first current source. A gate electrode of the first transistor is connected to the gate electrode of the power tube so as to form a current mirror with a current ratio of 1:K, and a source electrode and a drain electrode of the first transistor are connected to the input of the adjuster and the first current source respectively, where K is greater than 1.

In a possible implementation manner, the first transistor is a PMOS transistor.

In a possible implementation manner, the input current of the adjuster equals to $K*I1$ during the starting process thereof, where I1 is a current of the first current source.

In a possible implementation manner, the adjuster further includes a voltage-stabilizing charge pump, and the voltage-stabilizing charge pump is connected between the drain electrode of the power tube and the output of the adjuster.

In a possible implementation manner, a first switch is connected between the output of the error amplifier and the gate electrode of the power tube, a second switch is connected between the gate electrode of the first transistor and the gate electrode of the power tube, and a third switch is connected between the first current source and the drain electrode of the first transistor. When the trigger receives the first voltage signal, the first control signal controls the first switch to be turned off, and the second control signal controls the second switch and the third switch to be turned on. When the trigger receives the second voltage signal, the first control signal controls the first switch to be turned on, and the second control signal controls the second switch and the third switch to be turned off.

In a possible implementation manner, the negative feedback circuit further includes a buffer. The buffer includes a second current source and a second transistor. A gate electrode of the second transistor is connected to the output of the error amplifier, and a source electrode of the second transistor is connected to the second current source and the gate electrode of the power tube.

In a possible implementation manner, the input current of the adjuster equals to $K*(I1-I2)$ during the starting process, where I1 is a current of the first current source, I2 is a current of the second current source, and $I1>I2$.

In a possible implementation manner, a first switch is connected between the second current source and the source electrode of the second transistor, a second switch is connected between the gate electrode of the first transistor and the gate electrode of the power tube, and a third switch is connected between the first current source and the drain electrode of the first transistor. When the trigger receives the first voltage signal, the first control signal controls the first switch to be turned off, and the second control signal controls the second switch and the third switch to be turned on. When the trigger receives the second voltage signal, the first control signal controls the first switch to be turned on, and the second control signal controls the second switch and the third switch to be turned off.

In a possible implementation manner, the negative feedback circuit further includes a resistor string. The resistor string is connected between the output of the adjuster and the input of the error amplifier, and is configured to sample a voltage of the output signal output by the adjuster, and obtain the feedback voltage.

In a second aspect, a chip is provided, including the adjuster according to the forgoing first aspect or any possible implementation manners of the first aspect.

Based the forgoing technical solutions, two inputs of the error amplifier in the feedback circuit of the adjuster receive the reference voltage and the feedback voltage corresponding to the output signal respectively. During the starting process of the adjuster, the error amplifier is used to monitor whether the feedback voltage exceeds the reference voltage, and outputs the first voltage signal when the feedback voltage is less than the reference voltage, and outputs a second signal when the feedback voltage is greater than the reference voltage. The control circuit is connected to the output of the error amplifier, and can control the negative feedback circuit to be turned off and the constant current source circuit to be turned on according to the first voltage signal so as to control the input current of the adjuster to be constant during the starting process by the constant current source circuit; and control the constant current source circuit to be turned off and the negative feedback circuit to be turned on according to the second voltage signal so as to provide a negative feedback adjustment signal corresponding to the output signal to the power transfer circuit by the negative feedback circuit, and then the power transfer circuit may perform negative feedback adjustment to the output signal according to the negative feedback adjustment signal thereby maintaining the output signal at a preset level. Therefore, during the starting process of the adjuster, the constant current source circuit can control the input current of the adjuster to be constant, and implement an effective soft start. And during the starting process of the adjuster, the error amplifier is used to monitor whether the feedback circuit exceeds the reference voltage, and restore the negative feedback circuit when the feedback voltage exceeds the reference voltage thereby restoring the adjuster with a function of normal feedback adjustment. There is no need to add additional circuits and capacitors and resistors with large area, so that the area and power consumption of the adjuster chip is reduced, and the cost is reduced.

DESCRIPTION OF EMBODIMENTS

Technical solutions of embodiments of the present application is hereinafter described with reference to the accompanying drawings.

Adjusters include linear adjusters and switching adjusters, and the switching adjusters further include inductive switching adjusters and capacitive switching adjusters. An adjuster amplifies the difference between a feedback quantity and a reference quantity through an operational amplifier so that an output quantity is controlled not to change with changes in input voltage, load, etc., that is, to adjust for a stable output through a negative feedback loop.

During the start of the adjuster, because the difference between the feedback quantity and the reference value is too large, an excessive input current will be generated. And the excessive input current will increase overload pressure of a previous stage power supply such as a previous stage adjuster, cause the previous stage power supply to power down, damage external components of the adjuster, or burn a chip of the adjuster. Therefore, the adjuster must establish an output slowly at the initial phase to avoid a surge current by a way of soft starting.

The way of soft starting in prior art includes two categories. In the first category, the soft start control is implemented by limiting the output of the error amplifier in the adjuster through a clamping circuit. In order to ensure a maximum load capacity of the adjuster, the clamping value is generally set to two or more times the maximum current capacity, thus the way of soft starting in the first category can not fully control the input current so that a relatively large input current is still possible to exist when the adjuster establishes the output. In addition, the way in the first category of soft starting requires additional overhead such as comparator circuits or operational amplifier circuits, resistors or capacitors, which increases the area and power consumption of the adjuster chip. In the second category, a creeping up reference voltage is used to replace the reference voltage when the adjuster establishes the output, or the reference voltage is slowly raised in multiple stages through a complex circuit.

Either of the two categories of the way of soft starting, resistors, and capacitors with large area or additional circuits are required, thereby increasing the area and power consumption of the adjuster chip, or additional pins for attaching the capacitors externally.

Figure 1:
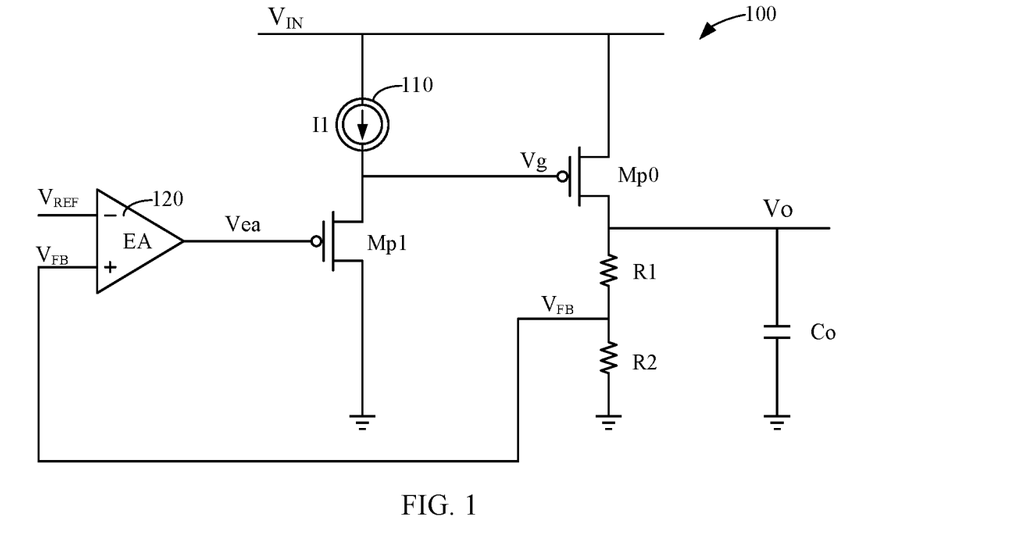
FIG. 1 is a principle diagram of an adjuster according to an embodiment of the present application.

FIG. 1 is a principle diagram of an adjuster according to an embodiment of the present application. In FIG. 1, a linear adjuster is described as an example. An adjuster 100 adopts the way of negative feedback adjustment, and an error amplifier 120 and a power tube Mp0 form a negative feedback loop. The error amplifier 120 provides a negative feedback adjustment signal to the power tube Mp0 so that the power tube Mp0 performs negative feedback adjustment to an output voltage Vo according to the negative feedback adjustment signal, thereby maintaining the output voltage Vo at a preset level. For example, as shown in FIG. 1, the resistor string composed of a resistor R1 and a resistor R2 samples the output voltage Vo, and a feedback voltage $V_{FB}$ is obtained. The feedback voltage $V_{FB}$ is input to a positive input of the error amplifier 120, and a negative input of the error amplifier 120 is connected to the reference voltage $V_{REF}$, and after the feedback voltage $V_{FB}$ and the reference voltage $V_{REF}$ are differentially amplified by the error amplifier 120, a voltage Vea is obtained. A current source 110 and a transistor Mp1 form a buffer. A voltage Vg is obtained after the voltage Vea passes through the buffer. The voltage Vg is used as a gate control signal of the power tube Mp0, which makes the power tube Mp0 perform negative feedback adjustment to the output voltage Vo.

During the starting of the adjuster 100, the output voltage Vo is needed to establish. However, the establishment of $V_{FB}$ is slower than $V_{REF}$, and initially $V_{FB}$ is much smaller than $V_{REF}$, which makes the difference between $V_{FB}$ and $V_{REF}$ very large, then the output voltage Vea output by the error amplifier 120 is very small, and the voltage Vg obtained after passing through the buffer is also very small, then the power tube Mp0 establishes the output voltage Vo with a large driving capacity, which generates a very large input current at an input voltage $V_{IN}$.

Thus, an embodiment of the present application provides an adjuster that can avoid generating an excessive input current during the starting process of the adjuster, and the structure of the circuit is simple.

Figure 2:
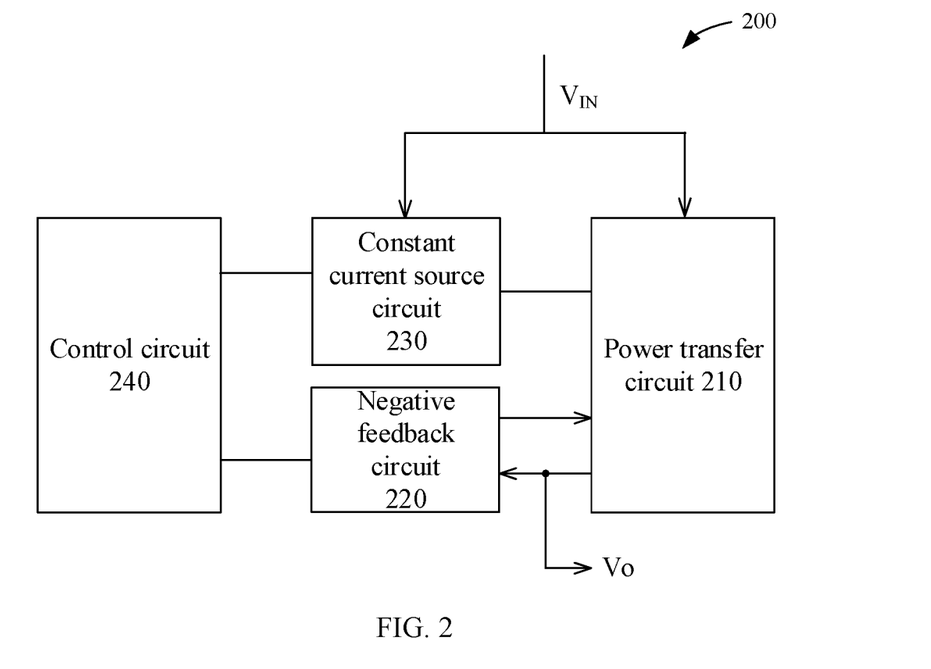
FIG. 2 is a schematic block diagram of an adjuster according to an embodiment of the present application.

FIG. 2 is a schematic block diagram of an adjuster according to an embodiment of the present application. As shown in FIG. 2, the adjuster includes a power transfer circuit 210, a negative feedback circuit 220, a constant current source circuit 230 and a control circuit 240.

The negative feedback circuit 220 includes an error amplifier 221. One input of the error amplifier 221 receives a reference voltage, and another input of the error amplifier 221 receives a feedback voltage corresponding to an output signal of the adjuster 221. The error amplifier 221 is configured to, during the starting process of the adjuster, output a first voltage signal when the feedback voltage is less than the reference voltage and output a second voltage signal when the feedback voltage is greater than the reference voltage.

The control circuit 240 is connected to an output of the error amplifier 221, and is configured to:

control the negative feedback circuit 220 to be turned off and the constant current source circuit 230 to be turned on according to the first voltage signal. When the constant current source circuit 230 is turned on, the constant current source circuit 230 is connected to the power transfer circuit 210, and is configured to control the input current of the adjuster 200 to be constant during the starting process thereof; and, control the constant current source circuit 230 to be turned off and the negative feedback circuit 220 to be turned on according to the second voltage signal. When the negative feedback circuit 220 is turned on, the negative feedback circuit 220 forms a negative feedback loop with the power transfer circuit 210, and is configured to provide a negative feedback adjustment signal corresponding to the output signal of the adjuster 200 to the power transfer circuit 210, and the power transfer circuit 210 is configured to perform negative feedback adjustment to the output signal according to the negative feedback adjustment signal, thereby making the output signal is maintained at a preset level.

In the embodiment, two inputs of the error amplifier 221 in the negative feedback circuit of the adjuster receive the reference voltage and the feedback voltage corresponding to the output signal respectively. During the starting process of the adjuster, the error amplifier 221 is used to monitor whether the feedback voltage exceeds the reference voltage, and outputs a first voltage signal when the feedback voltage is less than the reference voltage, and outputs a second signal when the feedback voltage is greater than the reference voltage. The control circuit is connected to the output of the error amplifier 221. The control circuit can control the negative feedback circuit to be turned off and the constant current source circuit to be turned on according to the first voltage signal so as to control the input current of the adjuster to be constant during the starting process thereof by the constant current source circuit; and control the constant current source circuit to be turned off and the negative feedback circuit to be turned on so as to provide the negative feedback adjustment signal corresponding to the output signal to the power transfer circuit, consequently the power transfer circuit can perform negative feedback adjustment to the output signal according to the negative feedback adjustment signal, thereby maintaining the output signal at the preset level.

Therefore, during the starting process of the adjuster, the constant current source circuit can control the input current of the adjuster to be constant, and implement an effective soft start. And during the starting process of the adjuster, the error amplifier is used to monitor whether the feedback circuit exceeds the reference voltage, and restore the negative feedback circuit when the feedback voltage exceeds the reference voltage thereby restoring the adjuster with a function of normal feedback adjustment. There is no need to add additional circuits and capacitors and resistors with large area, so that the area and power consumption of the adjuster chip is reduced, and the cost is reduced.

In other words, when the constant current source circuit 230 is turned off and the negative feedback circuit 220 is turned on, the error amplifier 221 is not only used in the negative feedback loop for negative feedback adjustment of the output signal, but also used to monitor whether the output signal Vo reaches the preset level during the starting process of the adjuster 200 when the negative feedback circuit 220 is turned off and the constant current source circuit is turned on.

It should be understood that the starting process in embodiments of the present application refers to the process of the adjuster establishing the output, that is, the process of the output signal of the adjuster increased to the preset level from 0V, which may also called the process of the soft starting. During the starting process of the adjuster, the output signal gradually increases, and therefore the feedback voltage corresponding to the output signal gradually increases, and when the feedback voltage exceeds the reference voltage, the output signal can be considered to have reached the preset level.

Figure 3:
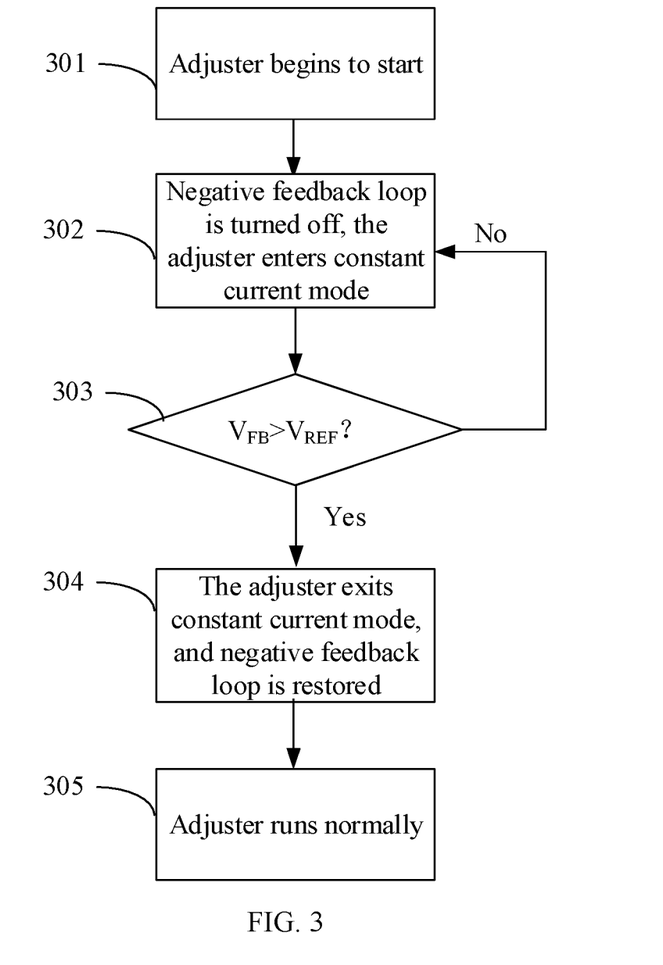
FIG. 3 is a schematic diagram of work flow of an adjuster according to an embodiment of the present application.

For example, as shown in FIG. 3, in 301, the adjuster begins to start. At this time, the adjuster needs to establish an output signal, that is, to increase the output signal of the adjuster to a preset level.

In 302, the negative feedback circuit 220 is turned off and the constant current source circuit 230 is turned on.

Because the feedback voltage $V_{FB}$ does not exceed the reference voltage $V_{REF}$ at the initialization phase, the control circuit 240 controls the constant current source circuit 230 to be turned on and enters a constant current mode, and controls the negative feedback circuit 220 to be turned off. At this time, the constant current source circuit 230 controls the input current of the adjuster to be a constant value during the starting process thereof.

In 303, the error amplifier 221 monitors whether the feedback voltage $V_{FB}$ exceeds the reference voltage $V_{REF}$.

If it monitors that the feedback voltage $V_{FB}$ still does not exceed the reference voltage $V_{REF}$, 302 is continued to be executed; and if it monitors that the feedback voltage $V_{FB}$ exceeds the reference voltage $V_{REF}$, 304 is executed.

In 304, the constant current source circuit 230 is turned off and the negative feedback circuit 220 is turned on.

The control circuit 240 controls the constant current source circuit 230 to be turned off and exits the constant mode, and controls the negative feedback circuit 220 to be turned on so that the adjuster operates normally to perform negative feedback adjustment to the output signal, thereby maintaining the output signal at the preset level.

After the forgoing steps, the output signal of the adjuster is gradually raised to the preset level during the starting process, and after it is raised to the preset level, it is maintained at the preset level by the negative feedback circuit 220 and the power transfer circuit 210.

During the starting process of the adjuster, the negative feedback circuit 220 is turned off and the constant current source circuit 230 is turned on, at this time the function as the comparator is implemented using the error amplifier 221 so that the starting process is monitored; when the starting process of the adjuster is completed, that is, after the output signal of the adjuster is raised from 0V to the preset level, the constant current source circuit 230 is turned off and the negative feedback circuit 220 is turned on, therefore the comparator 211 is restored to its function in the negative feedback loop, and is configured to amplify the voltage.

Optionally, in a possible implementation manner, the control circuit 240 includes a trigger 241. For example, the trigger 241 may be an edge trigger, a level trigger or a latch.

The trigger 241 is configured to receive the voltage signal output by the error amplifier 221 and generate a first control signal and a second control signal. The first control signal is configured to control the negative feedback circuit 220 to be turned off and on, and the second control signal is configured to control the constant current source circuit 230 to be turned off and on.

Further, optionally, the control circuit 240 further includes 2N inverters (INV) connected between the error amplifier 221 and the trigger 241, where N is a positive integer.

Optionally, in a possible implementation manner, the power transfer circuit 210 includes a power tube 211. The power tube 211, for example, may be a positive channel metal oxide semiconductor (PMOS) tube.

A gate electrode of the power tube 211 is connected to the output of the error amplifier 221, a source electrode and a drain electrode of the power tube 211 are connected to the input of the adjuster 200 and the output of the adjuster 200 respectively.

Optionally, in a implementation manner, the constant current source circuit 330 includes a first transistor 331 and a first current source 332. A gate electrode of the first transistor 331 is connected to the gate electrode of the power tube 211 so as to form a current mirror with a current ratio of 1:K, a source electrode and a drain electrode of the first transistor 331 are connected to the input of the adjuster 200 and the first current source 332 respectively, where K is greater than 1.

At this time, the first transistor 331 and the power tube 211 form the current mirror with a current ratio of 1:K. By setting a current I1 of the first current source 332 and parameters such as a width-to-length ratio of the gate and like of the first transistor 331, a value of K can be controlled.

Therefore, during the starting process of the adjuster 20, the input current can be accurately controlled at the constant value.

In the embodiment, during the starting process of the adjuster 200, the input current equals to K*I1, where I1 is a current of the first current source 332.

The form of the constant current source circuit 230 can be various. Besides adopting the form of a current mirror, the constant current source circuit 230 can also be connected to other forms as long as an output quantity can be ensured to be constant, which is not limited by the embodiments of the present application.

Optionally, in a possible implementation manner, the negative feedback circuit 220 further includes a buffer. The buffer includes a second current source 222 and a second transistor 223. A gate electrode of the second transistor 223 is connected to the output of the error amplifier 221, and a source electrode of the second transistor 223 is connected to the second current source 222 and the gate electrode of the power tube 211.

At this time, the input current of the adjuster 200 equals to K*(I1−I2) during the starting process, where I1 is a current of the first current source 332, I2 is a current of the second current source 223, and I1>I2.

After receiving the voltage signal output by the error amplifier 221, the control circuit 240 generates the first control signal for controlling the negative feedback circuit 220 and the second control signal for controlling the constant current source circuit 230. The first control signal and the second control signal may be switch control signal.

For example, when the adjuster 200 does not include the buffer composed of the second current source 222 and the second transistor 223, a first switch (SW) 1 is connected between the output of the error amplifier 332 and the gate electrode of the power tube 211, a second switch SW2 is connected between the gate electrode of the first transistor 331 and the gate electrode of the power tube 211, and a third switch SW3 is connected between the first current source 332 and the drain electrode of the first transistor 331. When the trigger 241 receives the first voltage signal, the first control signal controls the first switch SW1 to be turned off, and the second control signal controls the second switch SW2 and the third switch SW3 to be turned on; when the trigger 241 receives the second voltage signal, the first control signal controls the first switch SW1 to be turned on, and the second control signal controls the second switch SW2 and the third switch SW3 to be turned off.

Still for example, when the adjuster 200 includes the buffer composed of the second current source 222 and the second transistor 223, the first switch SW1 is connected between the second current source 222 and the source electrode of the second transistor 223, the second switch SW2 is connected between the gate electrode of the first transistor 331 and the gate electrode of the power tube 211, and the third switch SW3 is connected between the first current source 332 and the drain electrode of the first transistor 331. When the trigger 241 receives the first voltage signal, the first control signal controls the first switch SW1 to be turned off, and the second control signal controls the second switch SW2 and the third switch SW3 to be turned on; when the trigger 241 receives the second voltage signal, the first control signal controls the first switch SW1 to be turned on, and the second control signal controls the second switch SW2 and the third switch SW3 to be turned off.

Optionally, in a implementation manner, the negative feedback circuit 220 further includes a resistor string 224.

The resistor string 224 is connected between the output of the adjuster 200 and the input of the error amplifier 221, and is configured to sample a voltage of the output signal output by the adjuster 200, and obtain the feedback voltage.

Detailed description of a circuit structure of the adjuster in embodiments of the present application is hereinafter described with FIGS. 4 to 6.

Figure 4:
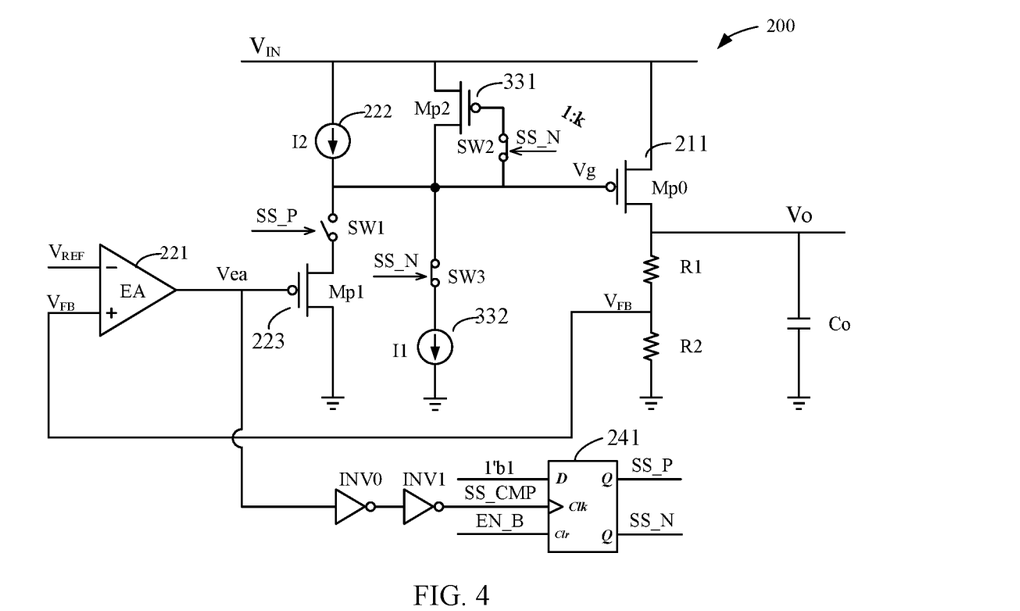
FIG. 4 is a schematic diagram of a possible implementation manner of the adjuster in an embodiment of the present application in FIG. 2.

FIG. 4 is a possible implementation manner of the adjuster 200 in FIG. 2. In the negative feedback circuit 220, the resistor string composed of the resistor R1 and the resistor R2 samples the output voltage Vo, and obtain the feedback voltage $V_{FB}$. The feedback voltage $V_{FB}$ is input to a positive end of the error amplifier 221, and a negative end of the error amplifier 221 is connected to the reference voltage $V_{REF}$. After the feedback voltage $V_{FB}$ and the reference voltage being differential amplified by the error amplifier 221, a voltage Vea is obtained. The second current source 222 and the second transistor 223 form a buffer. One end of the second current source 222 is connected to $V_{IN}$, another end is connected to the second transistor 223 through the switch SW1. The voltage Vg is obtained after the voltage Vea passes through the buffer, and used as the control signal of the gate electrode of the power tube 211. And the power tube 211 can perform negative feedback adjustment to the output voltage Vo according to the voltage Vg, thereby maintaining the output voltage Vo at the preset level.

The constant current source circuit 230 includes the first transistor 331 and the first current source 332. The gate electrode of the first transistor 331 is connected to the gate electrode of the power tube 221, forming a current mirror with a current ratio of 1:K. The switch SW3 is disposed between the gate electrode of the power tube 211 and one end of the first current source 332, and the other end of the first current source 332 is connected to the ground. The second switch SW2 is disposed between the gate electrode of the first transistor 331 and the gate electrode of the power tube 211.

The error amplifier 221 outputs the voltage Vea. After passing through two inverters INV0 and INV1 connected in series, the voltage Vea is used as an input clock signal Clk of the trigger 241. The trigger 241 is taken as an example of being a D trigger. A D input of the trigger 241 is connected to high level, an inverted signal EN_B of an enabled signal (EN) of the adjuster 200 is clear, the SS_P signal output by the output of the trigger 241 is used to control the switch SW1, and the SS_N signal output by an invert output of the trigger 241 is used to control the switches SW2 and SW3.

When the adjuster 200 does not start, EN=0, EN_B=1, the trigger 241 is clear, SS_P=0, and SS_N=1. When the adjuster 200 begins to start, EN=1, EN_B=0, and the trigger maintains the state in a previous moment, that is, SS_P=0, and SS_N=1. At this time, the switch SW1 is turned off, the switch SW2 and the switch SW3 are turned on, the negative feedback circuit 220 is turned off and the constant current source circuit 230 is turned on. The first transistor 331 and the power tube 211 forms the current mirror with a current ratio of 1:K. And because of I1>I2, the input current of the adjuster 200, i.e. the current at the voltage $V_{IN}$ is a constant value, that is, K*(I1−I2), thereby implementing an accurately controllable soft start.

During the starting process, the output signal Vo gradually increases, and $V_{FB}$ is gradually close to $V_{REF}$. When the output signal reaches the preset level, $V_{FB}$ is greater than $V_{REF}$, thus after the voltage Vea output by the error amplifier 221 is shaped by the inverters INV0 and INV1 and amplified, SS_CMP is obtained, which turns out to be a high level.

When the clock input signal Clk is at the rising edge, the trigger 241 outputs a Q, and Q=D=1, that is, SS_P=1, SS_N=0. Then the switch SW1 is turned on, the switch SW2 and the switch SW3 are turned off, and the negative feedback circuit 220 is restored to normal, at the same time, the first transistor 331 and the first current source 332 are turned off, and the adjuster 200 performs normal negative feedback adjustment to the output voltage Vo.

The D input of the trigger 241 is connected to the high level, after the negative feedback circuit 220 runs normally, then the trigger 241 will maintain at SS_P=1 and SS_N=0 whether the SS_CMP is an arbitrary value or will be input to the trigger 241 at the rising edge, so that the negative feedback circuit 220 runs normally.

In FIG. 4, during the starting process of the adjuster 200, the function of a comparator is implemented using the error amplifier 221. When the feedback voltage $V_{FB}$ received by the positive input of the error amplifier 221 is less than the reference voltage $V_{REF}$ received by its negative input, the inverter INV1 outputs a low level; and when the feedback voltage $V_{FB}$ received by its positive input is greater than the reference voltage $V_{REF}$ received by its negative input, the inverter INV1 outputs a high level.

It should be understood that, when the feedback voltage $V_{FB}$ is greater than the reference voltage $V_{REF}$, the SS_CMP obtained passing through the inverters INV0 and INV1 turns out to be the high level. However, by setting the inverters INV0 and INV1, the SS_CMP can also be changed to the high level when the feedback voltage $V_{FB}$ is close to the reference voltage $V_{REF}$, for example, the difference between the feedback voltage $V_{FB}$ and the reference voltage $V_{REF}$ is smaller than a threshold. This is not limited in the embodiment of the present application.

It can be seen that, during the starting process of the adjuster 200, firstly the negative feedback circuit 220 is turned off and the constant current source circuit 230 is turned on so as to control the input current of the adjuster to be the constant value, that is, K*(I1−I2), through the constant current source circuit 210, thereby implementing the effective soft start. In addition, during the starting process of the adjuster 200, the error amplifier 221 is used to monitor whether the reference voltage $V_{FB}$ exceeds the reference voltage $V_{REF}$, the constant current source circuit 230 is turned off and the negative feedback circuit 220 is restored when the feedback voltage $V_{FB}$ exceeds the reference voltage $V_{FB}$, thereby making the adjuster 200 perform the normal negative feedback adjustment to the output voltage Vo.

Figure 5:
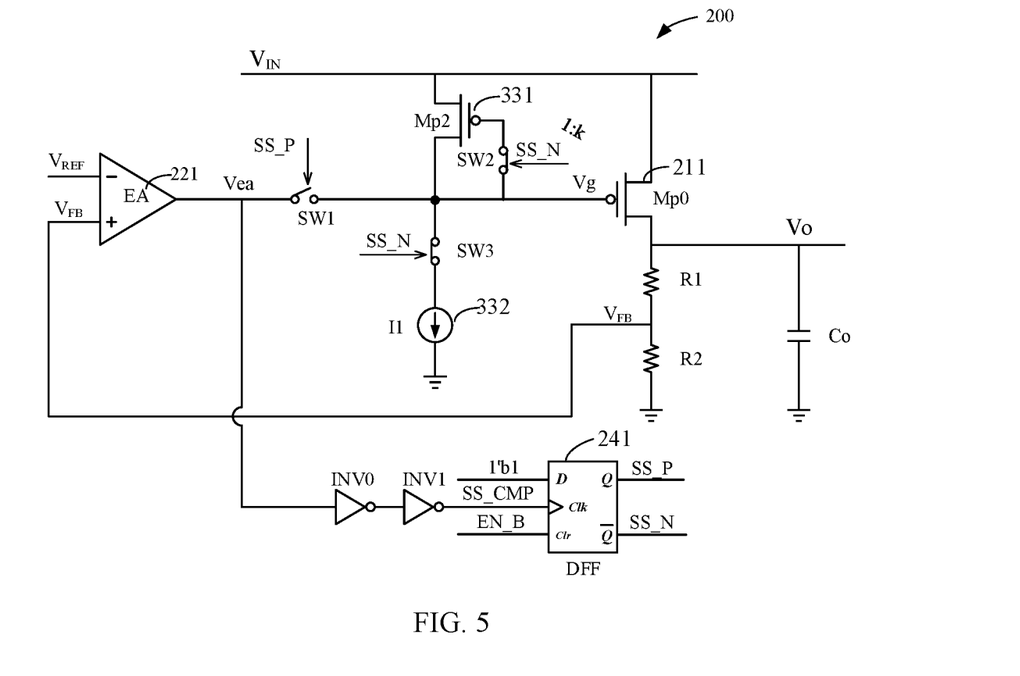
FIG. 5 is a schematic diagram of a possible implementation manner of the adjuster in an embodiment of the present application in FIG. 2.
Figure 6:
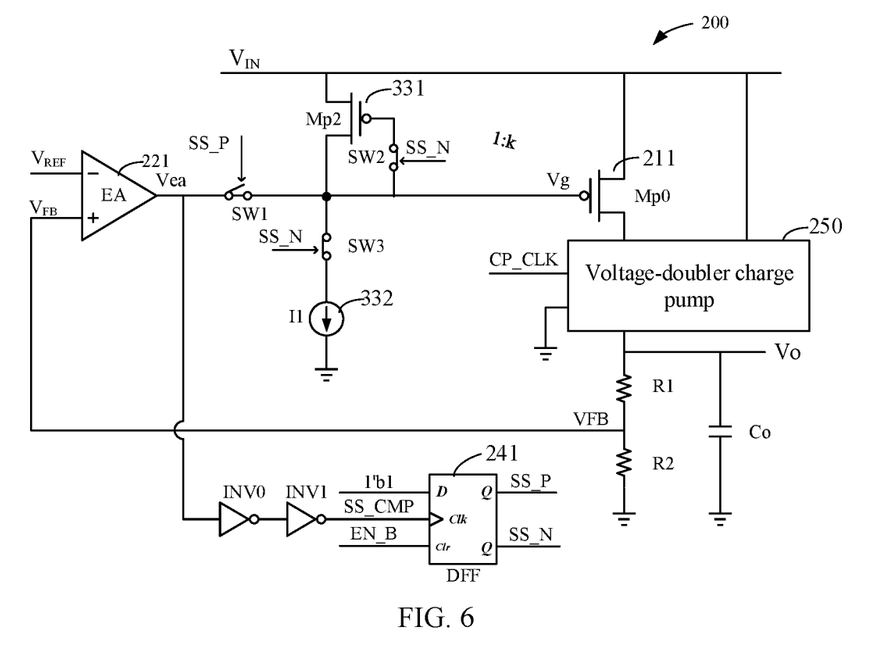
FIG. 6 is a schematic diagram of a possible implementation manner of the adjuster in an embodiment of the present application in FIG. 2.

FIG. 5 is a possible implementation manner of the adjuster in FIG. 2. What differs from FIG. 4 is that the adjuster in FIG. 5 does not include the buffer composed of the second current source 222 and the second transistor 223. The output of the error amplifier 221 is directly connected to the gate electrode of the power tube 211. In FIG. 5, during the starting process of the adjuster 200, the input current may be controlled to K*I1. Specific principles as shown in FIG. 5 may refer to related description in FIG. 4. For brevity, details are not described herein.

FIG. 4 and FIG. 5 show a linear adjuster. However, technical solutions in embodiments of the present application may by applied in any type of adjuster, such as a linear adjuster, a switch adjuster and so on. The switch adjuster as shown in FIG. 6, the adjuster 200 further includes a voltage-stabilizing charge pump 250, such as voltage-doubler charge pump. The voltage-stabilizing charge pump 250 is connected between the drain electrode of the power tube 211 and the output of the adjuster 200. In FIG. 6, during the starting process of the adjuster 200, the input current of the adjuster 200 may be controlled to K*I1. Specific principles as shown in FIG. 6 may refer to related description in FIG. 4. For brevity, details are not described herein.

The adjuster 200 in embodiments of the present application may be applied to an optical fingerprint chip and a touch control chip, or may be an independent adjuster chip.

The optical fingerprint chip is disposed under a display of an electronic device so as to implement under-display optical fingerprint detection, thereby obtaining user's fingerprint information.

The touch control chip is configured to detect user's touch information on a touch screen of an electronic device, such as position information and/or pressure information.

It should be noted that, in a case of no conflict, the various embodiments and/or the technical features in the various embodiments described in the present application may be combined with each other arbitrarily, and the technical solutions obtained after the combination should also fall within the protection scope of the present application.

It should be understood that the specific examples in the embodiments of the present application are only to help those skilled in the art to better understand the embodiments of the present application, but not to limit the scope of the embodiments of the present application. Various modifications and variations which fall within the scope of the present application can be made by those skilled in the art based on the foregoing embodiments.

The foregoing descriptions are merely specific implementation manners of the present application. However, the protection scope of the present application is not limited thereto, and those skilled in the art who are familiar with the art could readily think of variations or substitutions within the technical scope disclosed by the present application, and these variations or substitutions shall fall within the protection scope of the present application. Therefore, the protection scope of the present application shall be subject to the protection scope of the claims.

What is claimed is:

1. An adjuster, comprising a power transfer circuit, a negative feedback circuit, a constant current source circuit and a control circuit,
wherein the negative feedback circuit comprises an error amplifier; an input of the error amplifier receives a reference voltage, and another input of the error amplifier receives a feedback voltage corresponding to an output signal of the adjuster; the error amplifier is configured to, during the starting process of the adjuster, output a first voltage signal when the feedback voltage is less than the reference voltage and output a second voltage signal when the feedback voltage is greater than the reference voltage;
the control circuit is connected to an output of the error amplifier, and is configured to:
control the negative feedback circuit to be turned off and the constant current source circuit to be turned on according to the first voltage signal, wherein when the constant current source circuit is turned on, the constant current source circuit is connected to the power transfer circuit, and is configured to control an input current to be constant during the starting process of the adjuster; and,
control the constant current source circuit to be turned off and the negative feedback circuit to be turned on according to the second voltage signal, wherein when the negative feedback circuit is turned on, the negative feedback circuit forms a negative feedback loop with the power transfer circuit, and is configured to provide a negative feedback adjustment signal corresponding to the output signal to the power transfer circuit, and the power transfer circuit is configured to perform negative feedback adjustment to the output signal according to the negative feedback adjustment signal, thereby making the output signal is maintained at a preset level.

2. The adjuster according to claim 1, wherein the control circuit comprises a trigger, and the trigger is configured to:
receive a voltage signal output by the error amplifier and generate a first control signal and a second control signal, wherein the first control signal is configured to control the negative feedback circuit to be turned off and on, and the second control signal is configured to control the constant current source circuit to be turned off and on.

3. The adjuster according to claim 2, wherein the control circuit further comprises 2N inverters connected between the error amplifier and the trigger, where N is a positive integer.

4. The adjuster according to claim 1, wherein the power transfer circuit comprises a power tube, a gate electrode of the power tube is connected to the output of the error amplifier, and a source electrode and a drain electrode of the power tube are connected to the input of the adjuster and the output of the adjuster respectively.

5. The adjuster according to claim 4, wherein the constant current source circuit comprises a first transistor and a first current source; a gate electrode of the first transistor is connected to the gate electrode of the power tube so as to form a current mirror with a current ratio of 1:K, and a source electrode and a drain electrode of the first transistor are connected to the input of the adjuster and the first current source respectively, where K is greater than 1.

6. The adjuster according to claim 5, wherein the first transistor is a positive channel metal-oxide semiconductor PMOS transistor.

7. The adjuster according to claim 6, wherein the adjuster further comprises a voltage-stabilizing charge pump, and the voltage-stabilizing charge pump is connected between the drain electrode of the power tube and the output of the adjuster.

8. The adjuster according to claim 6, wherein the negative feedback circuit further comprises a buffer, and the buffer comprises a second current source and a second transistor, wherein a gate electrode of the second transistor is connected to the output of the error amplifier, and a source electrode of the second transistor is connected to the second current source and the gate electrode of the power tube.

9. The adjuster according to claim 5, wherein the input current of the adjuster equals to K*I1 during the starting process, where I1 is a current of the first current source.

10. The adjuster according to claim 9, wherein the adjuster further comprises a voltage-stabilizing charge pump, and the voltage-stabilizing charge pump is connected between the drain electrode of the power tube and the output of the adjuster.

11. The adjuster according to claim 5, wherein the adjuster further comprises a voltage-stabilizing charge pump, and the voltage-stabilizing charge pump is connected between the drain electrode of the power tube and the output of the adjuster.

12. The adjuster according to claim 5, wherein
a first switch is connected between the output of the error amplifier and the gate electrode of the power tube, a second switch is connected between the gate electrode of the first transistor and the gate electrode of the power tube, and a third switch is connected between the first current source and the drain electrode of the first transistor;

wherein when the trigger receives the first voltage signal, the first control signal controls the first switch to be turned off, and the second control signal controls the second switch and the third switch to be turned on; when the trigger receives the second voltage signal, the first control signal controls the first switch to be turned on, and the second control signal controls the second switch and the third switch to be turned off.

13. The adjuster according to claim 5, wherein the negative feedback circuit further comprises a buffer, and the buffer comprises a second current source and a second transistor, wherein a gate electrode of the second transistor is connected to the output of the error amplifier, and a source electrode of the second transistor is connected to the second current source and the gate electrode of the power tube.

14. The adjuster according to claim 13, wherein the input current of the adjuster equals to $K*(I1-I2)$ during the starting process, where I1 is a current of the first current source, I2 is a current of the second current source, and $I1>I2$.

15. The adjuster according to claim 14, wherein
a first switch is connected between the second current source and the source electrode of the second transistor, a second switch is connected between the gate electrode of the first transistor and the gate electrode of the power tube, and a third switch is connected between the first current source and the drain electrode of the first transistor;

wherein when the trigger receives the first voltage signal, the first control signal controls the first switch to be turned off, and the second control signal controls the second switch and the third switch to be turned on; when the trigger receives the second voltage signal, the first control signal controls the first switch to be turned on, and the second control signal controls the second switch and the third switch to be turned off.

16. The adjuster according to claim 13, wherein
a first switch is connected between the second current source and the source electrode of the second transistor, a second switch is connected between the gate electrode of the first transistor and the gate electrode of the power tube, and a third switch is connected between the first current source and the drain electrode of the first transistor;

wherein when the trigger receives the first voltage signal, the first control signal controls the first switch to be turned off, and the second control signal controls the second switch and the third switch to be turned on; when the trigger receives the second voltage signal, the first control signal controls the first switch to be turned on, and the second control signal controls the second switch and the third switch to be turned off.

17. The adjuster according to claim 1, wherein the negative feedback circuit further comprises a resistor string; the resistor string is connected between the output of the adjuster and the input of the error amplifier, and is configured to sample a voltage of the output signal output by the adjuster, and obtain the feedback voltage.

18. A chip, comprising the adjuster according to claim 1.

19. The chip according to claim 18, wherein the chip is an optical fingerprint chip, and the optical fingerprint chip is disposed under a display screen of an electronic device so as to implement under-display optical fingerprint detection.

20. The chip according to claim 18, wherein the chip is a touch control chip, and the touch control chip is configured to detect touch information of a user on a touch screen of the electronic device.

* * * * *